United States Patent
Mahajan et al.

(10) Patent No.: US 11,476,244 B2
(45) Date of Patent: Oct. 18, 2022

(54) LATERALLY-DIFFUSED METAL-OXIDE-SEMICONDUCTOR DEVICES FOR ELECTROSTATIC DISCHARGE PROTECTION APPLICATIONS

(71) Applicant: GLOBALFOUNDRIES Singapore Pte. Ltd., Singapore (SG)

(72) Inventors: Prantik Mahajan, Singapore (SG); Elaine Xiao Mei Low, Singapore (SG); Kyong Jin Hwang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/997,069

(22) Filed: Aug. 19, 2020

(65) Prior Publication Data
US 2022/0059525 A1    Feb. 24, 2022

(51) Int. Cl.
| H01L 29/76 | (2006.01) |
| H01L 29/94 | (2006.01) |
| H01L 27/02 | (2006.01) |
| H01L 29/06 | (2006.01) |
| H01L 29/66 | (2006.01) |
| H01L 29/78 | (2006.01) |

(Continued)

(52) U.S. Cl.
CPC .... *H01L 27/0274* (2013.01); *H01L 21/76224* (2013.01); *H01L 29/0653* (2013.01); *H01L 29/1095* (2013.01); *H01L 29/66681* (2013.01); *H01L 29/7816* (2013.01)

(58) Field of Classification Search
CPC ........... H01L 27/0274; H01L 21/76224; H01L 29/0653; H01L 29/1095; H01L 29/66681; H01L 29/7816

USPC ......................................................... 257/328
See application file for complete search history.

(56) References Cited

U.S. PATENT DOCUMENTS

| 6,831,331 B2 | 12/2004 | Kitamura et al. |
| 7,709,896 B2 | 5/2010 | Russ et al. |

(Continued)

FOREIGN PATENT DOCUMENTS

| DE | 102013214132 A1 | 5/2014 |
| EP | 3901993 A1 | 10/2021 |

(Continued)

OTHER PUBLICATIONS

DE, Office Action, German Patent Application No. 102021116596.2 issued by the German Patent and Trademark Office; pp. 1-6 (dated Jan. 28, 2022).

(Continued)

*Primary Examiner* — Theresa T Doan
(74) *Attorney, Agent, or Firm* — Thompson Hine LLP (57) ABSTRACT

Structures for a laterally-diffused metal-oxide-semiconductor device and methods of forming a structure for a laterally-diffused metal-oxide-semiconductor device. First and second source/drain regions are formed in a substrate, a gate electrode is formed over the substrate, an interconnect structure over the substrate, and a doped region is arranged in the substrate beneath the first source/drain region. The gate electrode is laterally positioned between the first and second source/drain regions, and the interconnect structure (Continued)

includes a contact connected to the first source/drain region. The doped region has a side edge that is laterally spaced from the contact by a distance.

20 Claims, 6 Drawing Sheets

(51) Int. Cl.
*H01L 21/762* (2006.01)
*H01L 29/10* (2006.01)

(56) References Cited

U.S. PATENT DOCUMENTS

| | | | |
|---|---|---|---|
| 9,153,666 | B1 | 10/2015 | Iravani et al. |
| 9,299,831 | B2 | 3/2016 | Matsuda |
| 10,170,907 | B2 | 1/2019 | Lai |
| 2005/0056896 | A1 | 3/2005 | Manna et al. |
| 2010/0065909 | A1 | 3/2010 | Ichijo |
| 2012/0161235 | A1 | 6/2012 | Huang et al. |
| 2013/0187218 | A1* | 7/2013 | Lai .................... H01L 29/0847 257/E29.256 |
| 2013/0207179 | A1 | 8/2013 | Lee et al. |
| 2015/0069509 | A1 | 3/2015 | Lee et al. |

FOREIGN PATENT DOCUMENTS

| | | |
|---|---|---|
| JP | 202098883 A | 6/2020 |
| TW | 201236134 A | 9/2012 |
| TW | 201423998 A | 6/2014 |

OTHER PUBLICATIONS

C. Chiang, P. Chang, P. Tseng, P. Lai, T. Tang and K. Su, "Optimization of PESD implant design for ESD robustness of 5V drain-back N-LDMOSFET," 2016 IEEE International Reliability Physics Symposium (IRPS), Pasadena, CA, 2016, pp. EL-3-1-EL-3-4, doi: 10.1109/IRPS.2016.7574604.

D. Lai, G. de Raad, W. Tseng, T. Smedes and A. J. Huitsing, "Bidirectional ESD Protection Device Using PNP With pMOS-Controlled Nwell Bias," in IEEE Electron Device Letters, vol. 39, No. 3, pp. 331-334, Mar. 2018, doi: 10.1109/LED.2018.2795253.

DE, Office Action, German Patent Application No. 102021116596.2 issued by the German Patent and Trademark Office; pp. 1-4 (dated May 12, 2022).

TW, Examination Report, Taiwan Patent Application No. 110126451 issued by the Taiwan Intellectual Property Office pp. 1-9 (dated May 11, 2022).

* cited by examiner

LATERALLY-DIFFUSED METAL-OXIDE-SEMICONDUCTOR DEVICES FOR ELECTROSTATIC DISCHARGE PROTECTION APPLICATIONS

BACKGROUND

The invention relates generally to semiconductor device and integrated circuit fabrication and, in particular, structures for a laterally-diffused metal-oxide-semiconductor device and methods of forming a structure for a laterally-diffused metal-oxide-semiconductor device.

An integrated circuit may be exposed to random electrostatic discharge (ESD) events that can direct potentially large and damaging ESD currents to the sensitive devices of integrated circuits on a chip. An ESD event refers to an unpredictable electrical discharge of a positive or negative current over a short duration and during which a large amount of current is directed to the integrated circuits. An ESD event may occur during post-manufacture chip handling or after chip installation on a circuit board or other carrier. The high current may originate from a variety of sources, such as the human body, a machine component, or a chip carrier.

Precautions may be taken to protect the integrated circuits on the chip from ESD events. One such precaution is to incorporate an on-chip protection circuit that is designed to avert damage to the sensitive devices of the integrated circuit during an ESD event. If an ESD event occurs, the protection circuit triggers a protection device to enter a low-impedance state that causes the protection device to conduct the ESD current to ground and shunt the ESD current away from the sensitive devices of the integrated circuit. The protection device is clamped by the protection circuit in its low-impedance state until the ESD current is drained and the ESD voltage is discharged to an acceptable level.

A type of protection device commonly deployed in such protection circuits is a silicon-controlled rectifier (SCR). The SCR is a four-layer solid state device that includes three electrodes or terminals, namely an anode, a cathode, and a gate, that are distributed among the four layers. In its quiescent state, the SCR restricts current conduction to leakage current. However, a voltage pulse applied to the gate by an ESD event causes the gate-to-cathode voltage to exceed an engineered threshold, known as the trigger voltage, and initiates the conduction of a forward current between the anode and cathode. Even after the trigger voltage is removed from the gate, the SCR remains clamped to conduct the forward current so long as the conducted current from the ESD event remains above an engineered holding current. When the conducted current from the ESD event drops below the holding current, the SCR returns to its quiescent state.

A laterally-diffused metal-oxide-semiconductor (LDMOS) device may be configured to be used as an embedded gate-grounded silicon-controlled rectifier (eGGSCR) in an ESD protection circuit. A problem with such LDMOS devices is that the trigger voltage may be too low for protection circuits used in high-voltage applications, such as automotive applications.

Improved structures for a laterally-diffused metal-oxide-semiconductor device and methods of forming a laterally-diffused metal-oxide-semiconductor device are needed.

SUMMARY

In an embodiment, a structure for a laterally-diffused metal-oxide-semiconductor device is provided. The structure includes first and second source/drain regions in a substrate, a gate electrode over the substrate, and an interconnect structure over the substrate. The gate electrode is laterally positioned between the first and second source/drain regions, and the interconnect structure includes a contact connected to the first source/drain region. The structure further concludes a doped region arranged in the substrate beneath the first source/drain region. The doped region has a side edge that is laterally spaced from the contact by a distance.

In an embodiment, a method of forming a structure for a laterally-diffused metal-oxide-semiconductor device is provided. The method includes forming first and second source/drain regions in a substrate, forming a gate electrode over the substrate that is laterally positioned between the first source/drain region and the second source/drain region, forming an interconnect structure over the substrate, and forming a doped region arranged in the substrate beneath the first source/drain region. The interconnect structure includes a contact connected to the first source/drain region, and the doped region has a side edge that is laterally spaced from the contact by a distance.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
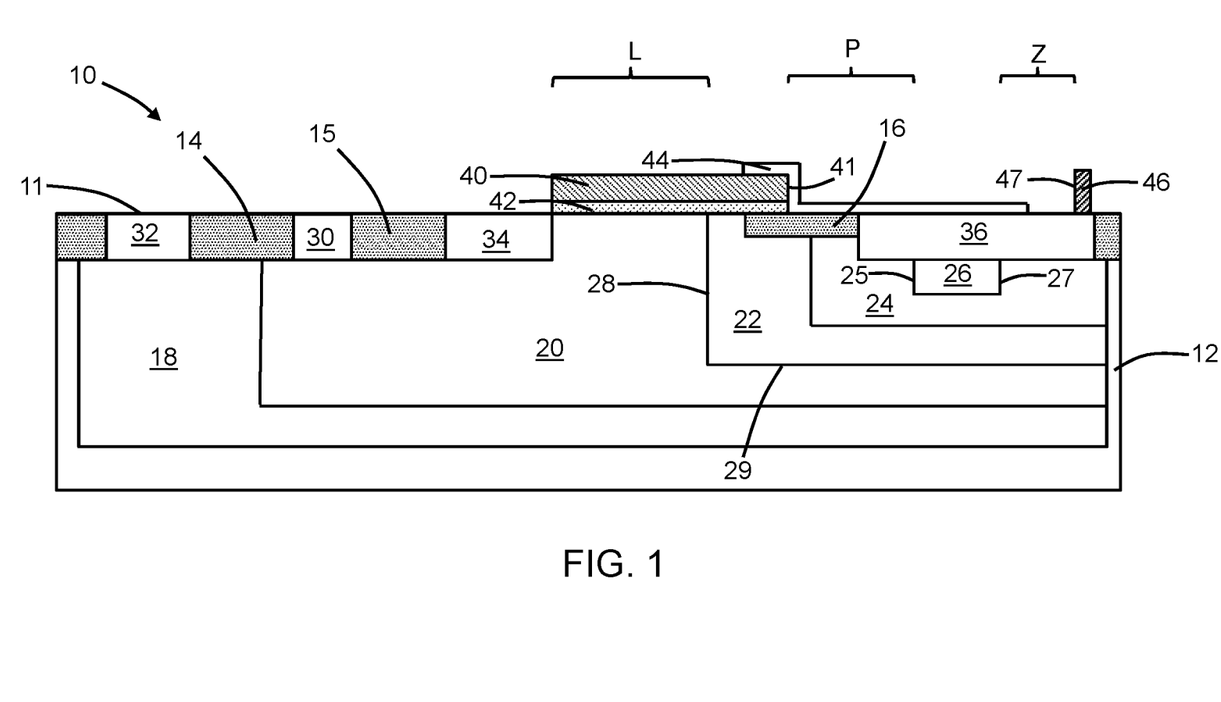
FIG. 1 is a cross-sectional view of a structure in accordance with embodiments of the invention.

With reference to FIG. 1 and in accordance with embodiments of the invention, a structure 10 for a laterally-diffused metal-oxide-semiconductor device includes a semiconductor substrate 12 and trench isolation regions 14, 15, 16 arranged in the semiconductor substrate 12. The semiconductor substrate 12 may be comprised of a single-crystal semiconductor material, such as single-crystal silicon, and may be lightly doped to have p-type conductivity. The trench isolation regions 14, 15, 16 may be formed by defining shallow trenches in the semiconductor substrate 12 with lithography and etching processes, depositing a dielectric material to fill the shallow trenches, and planarizing and/or recessing the dielectric material. The dielectric material comprising the trench isolation regions 14, 15, 16 may be an oxide of silicon (e.g., silicon dioxide) and/or another electrical insulator deposited by chemical vapor deposition.

Wells 18, 20 are formed in the semiconductor substrate 12 with the well 20 arranged fully between the well 18 and a top surface 11 of the semiconductor substrate 12. The well 18 is comprised of a semiconductor material doped to have an opposite conductivity type from the semiconductor material of the well 20. The well 18 may be formed by introducing a dopant by, for example, ion implantation with given implantation conditions into the semiconductor substrate 12. The well 20 may be formed by introducing a different dopant of opposite conductivity type by, for example, ion implantation in the semiconductor substrate 12. A patterned implantation mask may be formed to define a selected area on the top surface 11 that is exposed for each individual implantation. The implantation masks cover different areas on the top surface 11 in order to determine, at least in part, the location and horizontal dimensions of the wells 18, 20. Each implantation mask may include a layer of a material, such as an organic photoresist, that is applied and patterned such that areas on the top surface 11 are covered and masked. Each implantation mask has a thickness and stopping power sufficient to block the masked areas against receiving a dose of the implanted ions.

The implantation conditions (e.g., ion species, dose, kinetic energy) may be selected to tune the electrical and physical characteristics (e.g., electrical resistivity and depth profile) of the well 18. A separate set of implantation conditions (e.g., ion species, dose, kinetic energy) may be selected to tune the electrical and physical characteristics (e.g., electrical resistivity and depth profile) of the well 20. The well 20 may be surrounded on all sides below the top surface 11 by the well 18, which electrically isolates the well 20 from the semiconductor substrate 12. The wells 18, 20 may adjoin along an interface at which the conductivity type of the semiconductor material changes to provide a p-n junction. In an embodiment in which the semiconductor substrate 12 has p-type conductivity, the well 18 may contain semiconductor material doped with an n-type dopant (e.g., phosphorus and/or arsenic) to provide n-type conductivity, and the well 20 may contain semiconductor material doped with a p-type dopant (e.g., boron) to provide p-type conductivity.

A well 22, a well 24, and a doped region 26 are formed in a nested manner within the boundaries of the well 20. The wells 22, 24 are comprised of respective semiconductor materials doped to have an opposite conductivity type from the semiconductor material of the well 20. The doped region 26 is comprised of a semiconductor material doped to have an opposite conductivity type from the semiconductor materials of the wells 22, 24. In an embodiment in which the semiconductor substrate 12 has p-type conductivity, the wells 22, 24 may contain semiconductor material doped with an n-type dopant (e.g., phosphorus and/or arsenic) to provide n-type conductivity, and the doped region 26 may contain semiconductor material doped with a p-type dopant (e.g., boron) to provide p-type conductivity. The well 22 may contain a dopant concentration that is less than the dopant concentration of the well 24 in order to provide a high-voltage drift region in the structure 10.

The well 22 may be formed by introducing a dopant by ion implantation with given implantation conditions into the semiconductor substrate 12. The well 24 may be formed by introducing a dopant of the same conductivity type as the dopant of the well 22 by ion implantation with given implantation conditions into the semiconductor substrate 12. The doped region 26 may be formed by introducing a different dopant of opposite conductivity type to the wells 22, 24 by ion implantation with given implantation conditions into the semiconductor substrate 12. A patterned implantation mask may be formed to define a selected area on the top surface 11 that is exposed for each individual implantation. The implantation masks cover different areas on the top surface 11 in order to determine, at least in part, the location and horizontal dimensions of the wells 22, 24 and doped region 26. Each implantation mask may include a layer of a material, such as an organic photoresist, that is applied and patterned such that areas on the top surface 11 are covered and masked. Each implantation mask has a thickness and stopping power sufficient to block the masked areas against receiving a dose of the implanted ions.

The implantation conditions (e.g., ion species, dose, kinetic energy) may be selected to tune the electrical and physical characteristics (e.g., electrical resistivity and depth profile) of the well 22. A separate set of implantation conditions (e.g., ion species, dose, kinetic energy) may be selected to tune the electrical and physical characteristics (e.g., electrical resistivity and depth profile) of the well 24. A separate set of implantation conditions (e.g., ion species, dose, kinetic energy) may be selected to tune the electrical and physical characteristics (e.g., electrical resistivity and depth profile) of the doped region 26.

The well 24 may be surrounded on all sides below the top surface 11 by the well 22. The well 22 may be surrounded on all sides below the top surface 11 by the well 20. The wells 20, 22 may adjoin along an interface at which the conductivity type of the semiconductor material changes to define a p-n junction. The p-n junction has a segment 28 along an interface between the well 22 and a portion of the well 20, and the p-n junction has another segment 29 along an interface between the well 22 and another portion of the well 20. The segment 28 may be oriented in a direction, and the segment 29 may be oriented in another direction that is transverse to the direction of the segment 28. In an embodiment, the segment 28 may be oriented in a vertical direction, and the segment 29 may be oriented in a horizontal direction.

The well 24 and the doped region 26 may overlap and/or adjoin along an interface at which the conductivity type of the semiconductor material changes to provide a p-n junction. In an embodiment in which the well 20 has p-type conductivity, the semiconductor materials of the well 22 and the well 24 may be doped with an n-type dopant (e.g., phosphorus and/or arsenic) to provide n-type conductivity, and the semiconductor material of the doped region 26 may be doped with a p-type dopant (e.g., boron) to provide p-type conductivity.

A doped region 30 and doped regions 32, 34, 36 are formed in the semiconductor substrate 12 and are laterally arranged relative to the trench isolation regions 14, 15, 16. The doped regions 32, 34, 36 may have a conductivity of a polarity opposite to the conductivity type of the doped region 30. In an embodiment in which the well 20 has p-type conductivity, the semiconductor materials of the doped regions 32, 34, 36 may be doped with an n-type dopant (e.g., phosphorus and/or arsenic) to provide n-type conductivity, and the semiconductor material of the doped region 30 may be doped with a p-type dopant (e.g., boron) to provide p-type conductivity. The doped region 30 may be formed by implanting ions (e.g., ions of the p-type dopant) with an implantation mask formed on the top surface 11 and defining the intended location for the doped region 30 in the semiconductor substrate 12. The doped regions 32, 34, 36 may be formed by implanting ions (e.g., ions of the n-type dopant) with a different implantation mask formed on the top surface 11 and defining the intended locations for the doped regions 32, 34, 36 in the semiconductor substrate 12.

The doped region 30, which is coupled to the well 20, is doped to have the same conductivity type as well 20 but at a higher dopant concentration than well 20. The doped region 32, which is coupled to the well 18, is doped to have the same conductivity type as well 18 but at a higher dopant concentration than well 18. The doped region 34, which is also coupled to the well 20, is doped to have a conductivity type of a polarity opposite to the conductivity type of the well 20. The doped region 36, which is coupled to the well 24 and to the doped region 26, is doped to have a conductivity type of a polarity opposite to the conductivity type of the doped region 26 and the same polarity as the conductivity type of the well 24.

The doped region 34 and the doped region 36 provide source/drain regions of the structure 10 for the laterally-diffused metal-oxide-semiconductor device. As used herein, the term "source/drain region" means a doped region of semiconductor material that can function as either a source or a drain of a field-effect transistor. In an embodiment, the doped region 34 may provide a source of the structure 10, and the doped region 36 may provide a drain of the structure 10. The source 34 also provides a cathode of the silicon-controlled rectifier and the doped region 36 provides an anode of the silicon-controlled rectifier.

The doped region 26 is fully surrounded by semiconductor material of the opposite conductivity type. In particular, the doped region 26 is surrounded on multiple sides by the well 24, and the doped region 36 is positioned between the doped region 26 and the top surface 11. A portion of the doped region 36 has an interface with the well 24 of the same conductivity type, and another portion of the doped region 36 defines a junction along an interface with the doped region 26.

A gate electrode 40 and a gate dielectric 42 are formed over the top surface 11 of the semiconductor substrate 12 with the gate dielectric 42 arranged between the gate electrode 40 and the top surface 11. The gate electrode 40 and gate dielectric 42 overlap in part with the trench isolation region 16 to provide a field plate extension. The gate electrode 40 and gate dielectric 42 also overlap with a portion of the well 20 and a portion of the well 22. The gate electrode 40 may be comprised of doped polysilicon and the gate dielectric 42 may be comprised of silicon dioxide.

The well 20 includes a portion that extends beneath the wells 22, 24. This portion of the well 20, the wells 22, 24, and the doped region 26 provide a parasitic floating vertical PNP, during operation as an ESD protection device, because of the extension of the well 20 beneath the wells 22, 24. The trench isolation region 16 is arranged in a drain break on the device drain side between the doped region 36 and the gate electrode 40.

A dielectric layer 44 is formed that conformally covers a portion of the gate electrode 40, a portion of the trench isolation region 16, and a portion of the doped region 36. The doped region 26 may be laterally arranged beneath the dielectric layer 44. The dielectric layer 44 may be comprised of silicon nitride that is conformally deposited and then patterned with lithography and etching processes. The overlap of the dielectric layer 44 with the gate electrode 40, the trench isolation region 16, and the doped region 36 may function to improve the handling of current during an electrostatic discharge event.

Middle-of-line (MOL) processing and back-end-of-line (BEOL) processing follow, which includes formation of an interconnect structure coupled with the structure 10. In particular, a contact 46 is formed that is coupled with the doped region 34. Other contacts (not shown) may be formed that are used to connect the gate electrode 30, the doped region 40, and the doped region 36 with an interconnect wire coupled to ground.

In use, the structure 10 for the laterally-diffused metal-oxide-semiconductor device may be deployed as an embedded gate-grounded silicon-controlled rectifier (eGGSCR) in a electrostatic discharge (ESD) circuit. A parasitic floating PNP bipolar transistor defined by the doped region 26, the wells 22, 24 and the well 20 is leveraged to provide the eGGSCR action. The doped region 26, the wells 22, 24 and the portion of the well 20 laterally adjacent to the well 22 provide a parasitic floating lateral PNP bipolar transistor. The doped region 26, the wells 22, 24 and the portion of the well 20 beneath the well 22 provide a parasitic floating vertical PNP bipolar transistor that is additive to the parasitic floating lateral PNP bipolar transistor.

The doped region 26 has a side edge 27 that is laterally spaced from the closest portion of the contact 46, such as a side edge 47 of the contact 46 by a spacing or distance, Z. The distance, Z, can be varied to adjust the ESD design window for reliable operation without failure and to adjust the failure current of the structure 10. In an embodiment, the dielectric layer 44 may extend over the doped region 36 to terminate at a location that is closer to the contact 46 than the doped region 26. The distance, Z, is a finite distance in a range of greater than 0 and less than or equal to 1.5 microns that defines the size of the gap between the side edge 27 of the doped region 26 and the closest portion of the contact 46 (e.g., the side edge 47 of the contact 46).

The doped region 26 also has an opposite side edge 25 that is laterally spaced from a side edge 41 of the gate electrode 40 by a gap with a size given by a spacing or distance, P. The distance, P, can be varied to tune the trigger voltage (i.e., the maximum voltage before the device turns on (i.e., triggers) and snaps back to the holding voltage) of the structure 10. For example, the trigger voltage may be increased by varying the distance, P, to make the structure 10 suitable to provide electrostatic discharge protection in high-voltage applications, such as automotive applications. The holding voltage of the structure 10 can be tuned by adjusting the value of the gate length, L. The structure 10 may be tuned to provide an increased holding voltage (e.g., up to 20 volts) when used in a power clamp application. The structure 10 may be tuned to provide an increased trigger voltage (e.g., greater than 40 volts) when used in an input/output (I/O) clamp application. These improvements in trigger and holding voltage may be provided without significantly increasing the device footprint of the structure 10.

Figure 2:
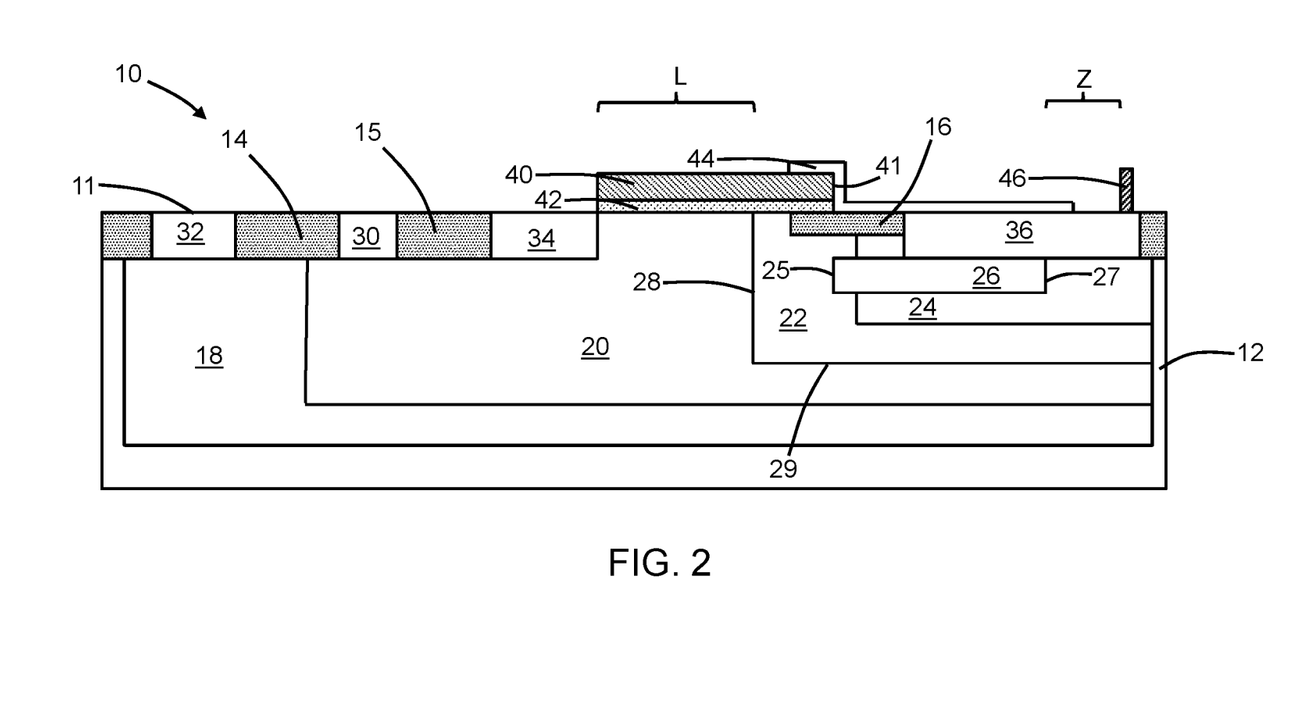
FIGS. 2-6 are cross-sectional views of device structures in accordance with alternative embodiments of the invention.

With reference to FIG. 2 in which like reference numerals refer to like features in FIG. 1 and in accordance with embodiments of the invention, the structure 10 may be modified such that the side edge 25 of the doped region 26 is self-aligned to a side edge 41 of the gate electrode 40. In effect, the value of the distance, P, is set equal to zero (0). The doped region 26 may be formed after forming the gate electrode 40 in order to provide the self-alignment.

Figure 3:
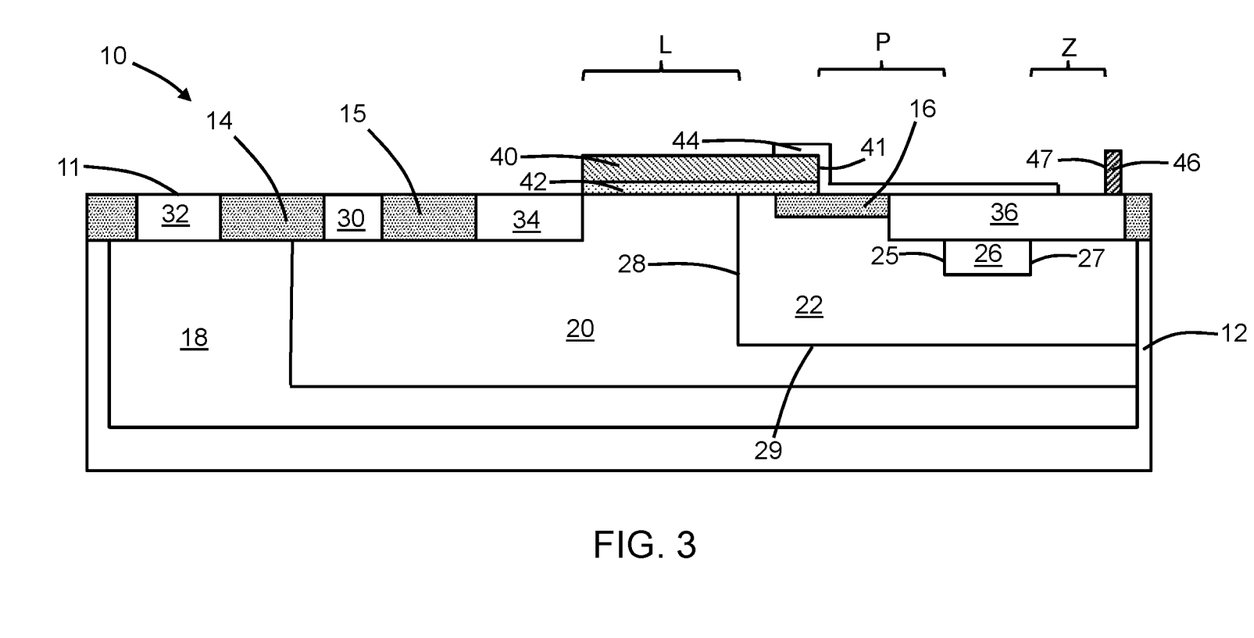

With reference to FIG. 3 in which like reference numerals refer to like features in FIG. 1 and in accordance with embodiments of the invention, the well 24 may be eliminated such that the doped region 26 is partially surrounded beneath the doped region 36 by the well 22, which has a lower dopant concentration than the eliminated well 24.

Figure 4:
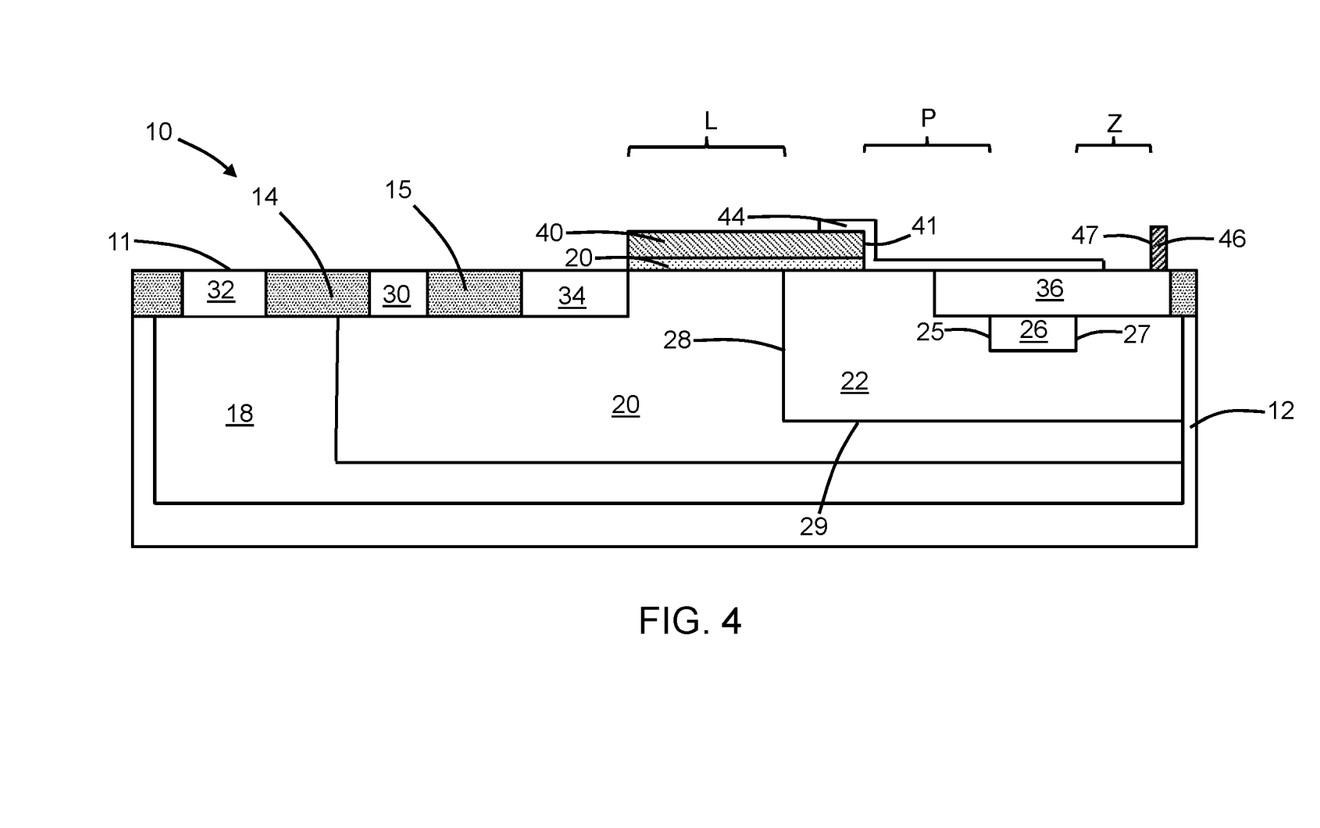

With reference to FIG. 4 in which like reference numerals refer to like features in FIG. 3 and in accordance with embodiments of the invention, the structure 10 may be modified to eliminate the trench isolation region 16. A portion of the well 22 is located in the space between the gate electrode 40 and the doped region 36. The structure 10 of FIG. 3, which includes the trench isolation region 16, may exhibit a higher trigger voltage than the structure 10 of FIG. 4.

Figure 5:
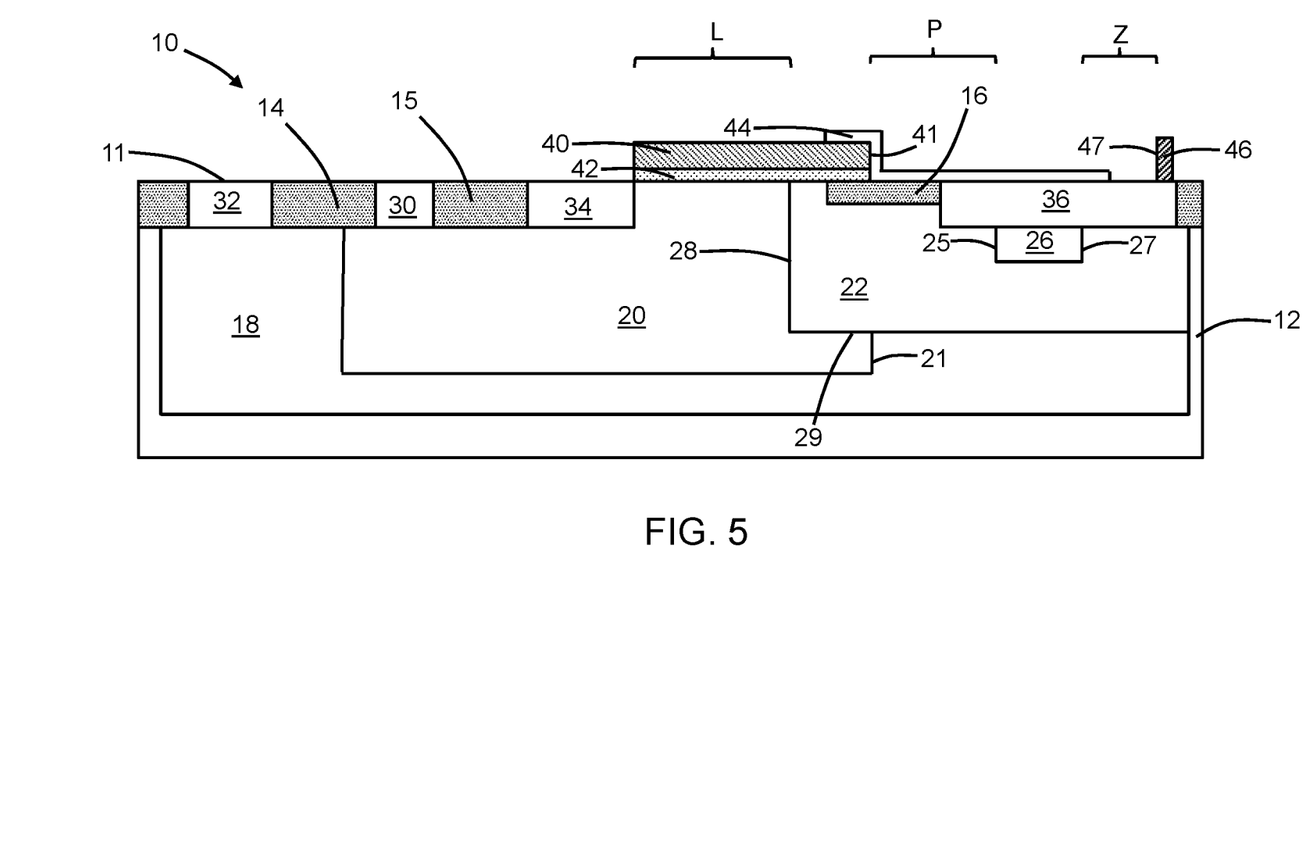

With reference to FIG. 5 in which like reference numerals refer to like features in FIG. 3 and in accordance with embodiments of the invention, the well 20 may be pulled back toward the gate electrode 40 such that the well 20 only extends beneath a portion of the well 22. In an embodiment, the well 20 may have a side edge 21 beneath the well 22 that is aligned with the side edge 41 of the gate electrode 40. The segment 28 of the p-n junction between the wells 20, 22 may be unchanged, and the segment 29 between the wells 20, 22 is shortened. A portion of the well 22 adjoins the well 20 adjacent to the segment 29. The structure 10 of FIG. 3 may exhibit a higher trigger voltage than the structure 10 of FIG. 5 with the pulled-back well 20.

Figure 6:
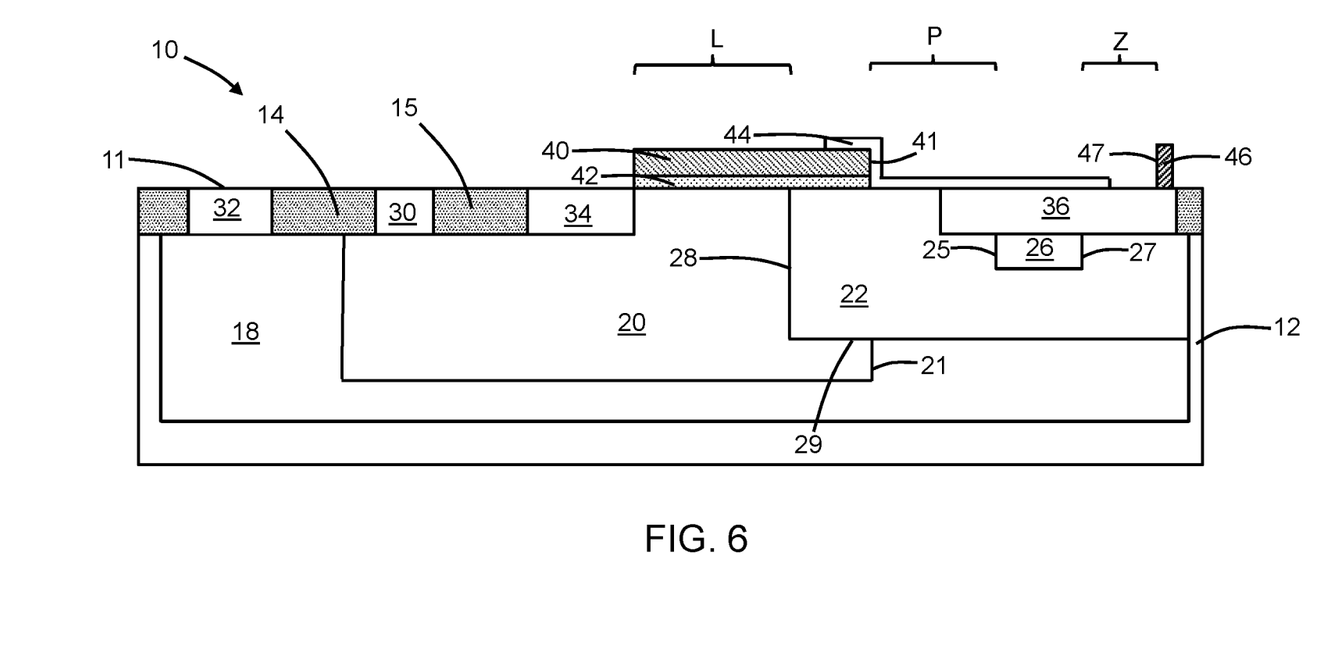

With reference to FIG. 6 in which like reference numerals refer to like features in FIG. 5 and in accordance with embodiments of the invention, the structure 10 may be modified to eliminate the trench isolation region 16. A portion of the well 22 is located in the space between the gate electrode 40 and the doped region 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a laterally-diffused metal-oxide-semiconductor device, the structure comprising:
    a substrate;
    a first source/drain region and a second source/drain region in the substrate;
    a gate electrode over the substrate, the gate electrode laterally positioned between the first source/drain region and the second source/drain region;
    an interconnect structure over the substrate, the interconnect structure including a contact connected to the first source/drain region; and
    a doped region arranged in the substrate beneath the first source/drain region, the doped region having a side edge that is laterally spaced from the contact by a distance, and the doped region fully positioned in a lateral direction between the gate electrode and the contact.

2. The structure of claim 1 wherein the first source/drain region and the second source/drain region have a first conductivity type, and the doped region has a second conductivity type of opposite polarity to the first conductivity type.

3. The structure of claim 1 wherein the first source/drain region and the second source/drain region have n-type conductivity, and the doped region has p-type conductivity.

4. The structure of claim 1 further comprising:
    a first well in the substrate; and
    a second well in the substrate, the second well positioned between the first source/drain region and the first well, wherein the doped region is positioned in the second well.

5. The structure of claim 4 wherein the first well and the doped region have a first conductivity type, and the second well has a second conductivity type of opposite polarity to the first conductivity type.

6. A structure for a laterally-diffused metal-oxide-semiconductor device, the structure comprising:
    a substrate;
    a first source/drain region and a second source/drain region in the substrate;
    a gate electrode over the substrate, the gate electrode laterally positioned between the first source/drain region and the second source/drain region;
    a first well in the substrate;
    a second well in the substrate, the second well positioned between the first source/drain region and the first well;
    an interconnect structure over the substrate, the interconnect structure including a contact connected to the first source/drain region; and
    a doped region arranged in the substrate beneath the first source/drain region, the doped region is positioned in the second well, and the doped region having a side edge that is laterally spaced from the contact by a distance,
    wherein the first well includes a first portion laterally adjacent to the second well and a second portion beneath the second well, the first well and the second well define a junction, the junction has a first segment between the first portion of the first well and the second well, and the junction has a second segment between the second portion of the first well and the second well.

7. The structure of claim 6 wherein the second portion of the first well extends fully beneath the second well.

8. The structure of claim 6 wherein the second portion of the first well extends partially beneath the second well.

9. The structure of claim 1 further comprising:
a well in the substrate,
wherein the doped region is positioned in the well, the first source/drain region is positioned over the doped region in the well, and the first source/drain region and the well fully surround the doped region.

10. The structure of claim 9 wherein the first source/drain region and the well have a first conductivity type, and the doped region has a second conductivity type of opposite polarity to the first conductivity type.

11. The structure of claim 1 further comprising:
a trench isolation region in the substrate, the trench isolation region positioned in the substrate adjacent to the first source/drain region,
wherein the gate electrode includes a first portion positioned over the trench isolation region.

12. The structure of claim 11 further comprising:
a first well in the substrate; and
a second well in the substrate, the second well positioned between the first source/drain region and the first well,
wherein the doped region and the trench isolation region are positioned in the second well, and the gate electrode includes a second portion positioned over the first well and a third portion positioned over the second well.

13. The structure of claim 11 further comprising:
a conformal dielectric layer positioned over the substrate, the conformal dielectric layer arranged to overlap in part with the gate electrode and to overlap in part with the trench isolation region.

14. A method of forming a structure for a laterally-diffused metal-oxide-semiconductor device, the method comprising:
forming a first source/drain region and a second source/drain region in a substrate;
forming a gate electrode over the substrate that is laterally positioned between the first source/drain region and the second source/drain region;
forming an interconnect structure over the substrate; and
forming a doped region arranged in the substrate beneath the first source/drain region,
wherein the interconnect structure includes a contact connected to the first source/drain region, the doped region has a side edge that is laterally spaced from the contact by a distance, and the doped region is fully positioned in a lateral direction between the gate electrode and the contact.

15. The method of claim 14 further comprising:
forming a first well in the substrate; and
forming a second well in the substrate,
wherein the second well is positioned between the first source/drain region and the first well, the doped region is positioned in the second well, and the first well and the doped region have p-type conductivity, and the second well has n-type conductivity.

16. The method of claim 15 wherein the first well includes a first portion laterally adjacent to the second well and a second portion beneath the second well, the first well and the second well define a junction, the junction has a first segment between the first portion of the first well and the second well, and the junction has a second segment between the second portion of the first well and the second well.

17. The method of claim 14 further comprising:
forming a well in the substrate,
wherein the doped region is positioned in the well, the first source/drain region is positioned over the doped region in the well, the first source/drain region and the well fully surround the doped region, the first source/drain region and the well have a first conductivity type, and the doped region has a second conductivity type of opposite polarity to the first conductivity type.

18. The structure of claim 4 wherein the first well includes a first portion laterally adjacent to the second well and a second portion beneath the second well, the first well and the second well define a junction, the junction has a first segment between the first portion of the first well and the second well, and the junction has a second segment between the second portion of the first well and the second well.

19. The structure of claim 18 wherein the second portion of the first well extends fully beneath the second well.

20. The structure of claim 18 wherein the second portion of the first well extends partially beneath the second well.

* * * * *